(12) United States Patent
Song

(10) Patent No.: US 8,125,841 B2
(45) Date of Patent: Feb. 28, 2012

(54) APPARATUS FOR GENERATING OUTPUT DATA STROBE SIGNAL

(75) Inventor: Seong-Hwi Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 130 days.

(21) Appl. No.: 12/649,404

(22) Filed: Dec. 30, 2009

(65) Prior Publication Data

US 2011/0158009 A1  Jun. 30, 2011

(30) Foreign Application Priority Data

Dec. 28, 2009 (KR) .................. 10-2009-0131930

(51) Int. Cl.
*G11C 7/00* (2006.01)
(52) U.S. Cl. .................. 365/193; 365/194; 365/233.1
(58) Field of Classification Search .................. 365/193, 365/194, 189.05, 233.1
See application file for complete search history.

(56) References Cited

U.S. PATENT DOCUMENTS 6,177,807 B1 * 1/2001 Bertin et al. .................. 326/30

FOREIGN PATENT DOCUMENTS

| KR | 1020050108041 | 11/2005 |
| KR | 1020060134079 | 12/2006 |

OTHER PUBLICATIONS

Notice of Allowance issued from Korean Intellectual Property Office on Feb. 24, 2011.

* cited by examiner

*Primary Examiner* — Huan Hoang
(74) *Attorney, Agent, or Firm* — IP & T Group LLP

(57) ABSTRACT

An apparatus for generating an output data strobe signal include a timing control unit configured to detect a specific data pattern and to generate a plurality of timing control signals corresponding to the detected data pattern in response to a clock signal; and a strobe signal generating unit configured to generate at least one strobe signal in response to the clock signal, and to adjust transition timings of the strobe signal in response to the timing control signals.

22 Claims, 13 Drawing Sheets

APPARATUS FOR GENERATING OUTPUT DATA STROBE SIGNAL

CROSS-REFERENCE TO RELATED APPLICATIONS

The present application claims priority of Korean Patent Application No. 10-2009-0131930, filed on Dec. 28, 2009, which is incorporated herein by reference in its entirety.

BACKGROUND OF THE INVENTION

Exemplary embodiments of the present invention relate to a semiconductor memory device, and more particularly, to an output data strobe signal generating circuit for generating an output data strobe signal.

The typical double data rate (DDR) semiconductor memory device generates output data in synchronization with every rising time and falling timing of a clock signal. When the output data are generated, it requires outputting an output data strobe signal in synchronization with the generation of the output data. Accordingly, a receiving apparatus can receive the output data from the DDR semiconductor memory device in response to the output data strobe signal.

In other words, the DDR semiconductor memory device is provided with an output data strobe signal generating apparatus to generate an output data strobe signal, which is toggled in synchronization with every rising time and falling timing of a clock signal, in response to a read command.

The DDR semiconductor memory device outputs an output data strobe (DQS) signal and an inverted output data strobe (DQSB) signal, which have inverse phases from each other and are respectively toggled in synchronization with every rising timing and falling timing of a clock signal. In order to stably drive an output driver (TX), a "Vox" denoting a voltage difference between an output cross point voltage of the DQS signal and the DQSB signal and a half power supply voltage (VDDQ/2) of the output driver (TX) have to satisfy a preset voltage limitation, e.g., ±100 mV, as shown in FIG. 1.

Generally, when an AC characteristic of a power supply voltage of the output driver such as VDDQ and VSSQ varies according to data patterns, a drivability to the output driver (TX) also varies. As a result, the "Vox" characteristics are affected by the data patterns. Accordingly, it requires measuring the "Vox" characteristics with respect to various data patterns.

FIG. 2 is a waveform diagram illustrating various data patterns,

Referring to FIG. 2, the data patterns include an ALL-IN data pattern, an ALL-OUT data pattern, a NO-BIT data pattern, an ABAB data pattern and a BABA data pattern.

In the ALL-IN data pattern, all of the output data (DQ) have substantially the same waveform as an output data strobe (DQS) signal. In the ALL-OUT data pattern, all of the output data (DQ) have substantially the same waveform as an inverted output data strobe (DQSB) signal. In the NO-BIT data pattern, all of the output data (DQ) are fixed to a logic low level or a logic high level. In the ABAB data pattern, even data of the output data (DQ) have substantially the same waveform as the DQS signal while odd data of the output data (DQ) have substantially the same waveform as the DQSB signal. In the BABA data pattern, odd data of the output data (DQ) have substantially the same waveform as the DQS signal while even data of the output data (DQ) have substantially the same waveform as the DQSB signal.

FIG. 3 is a timing diagram illustrating variations of the Vox characteristic with respect to the ALL-IN and ALL-OUT data patterns on the basis of the NO-BIT data pattern.

Referring to FIG. 3, in the case of the NO-BIT data pattern, an output cross point voltage of the DQS signal and the DQSB signal is positioned near to a half power supply voltage (VDDQ/2). However, in the case of the ALL-IN and ALL-OUT data patterns, the output cross point voltage of the DQS signal and the DQSB signal is away from the VDDQ/2 voltage. As a result, the Vox characteristics are deteriorated.

In particular, the Vox characteristics are severely deteriorated in the ALL-IN and ALL-OUT data patterns. Since all of the output data (DQ) have substantially the same waveform as the DQS signal in the ALL-IN data pattern, a slew of the DQS signal gets smaller and thus, rising and falling timings of the DQS signal are delayed. On the contrary, since all of the output data (DQ) have substantially the opposite waveform to the DQS signal in the ALL-OUT data pattern, a slew of the DQS signal increases and thus, the rising and falling timings of the DQS signal are advanced. Likewise, the rising and falling timings of the DQSB signal are delayed or advanced as opposed to the DQS signal. As a result, the Vox characteristics are severely deteriorated.

FIG. 4 is a timing diagram illustrating variations of the Vox characteristics with respect to the ABAB and BABA data patterns on the basis of the NO-BIT data pattern.

Referring to FIG. 4, in the case of the ABAB data pattern, the rising and falling timings of the DQS signal and the DQSB signal are delayed or advanced in the same manner as the ALL-IN data pattern. In the case of the BABA data pattern, the rising and falling timings of the DQS signal and the DQSB signal are delayed or advanced in the same manner as the ALL-OUT data pattern. That is, in both cases, the Vox characteristics are further affected by the even data of the output data (DQ).

As described above, when the conventional output driver (TX) is designed, the Vox characteristics cannot satisfy the requirements of the semiconductor memory device since the rising and falling timings of the output data (DQ) and the DQS signal vary according to the data patterns.

SUMMARY OF THE INVENTION

An embodiment of the present invention is directed to an output data strobe signal generating circuit of a semiconductor memory device capable of improving Vox characteristics by controlling transition timings of a data strobe signal according to data patterns affecting the Vox characteristics.

In accordance with an embodiment of the present invention, an apparatus for generating an output data strobe signal includes: a timing control unit configured to detect a specific data pattern and to generate a plurality of timing control signals corresponding to the detected data pattern in response to a clock signal; and a strobe signal generating unit configured to generate at least one strobe signal in response to the clock signal, and to adjust transition timings of the strobe signal in response to the timing control signals.

The timing control unit may output the timing control signals to advance the transition timings of the strobe signal in response to even data of output data having substantially the same waveform as the strobe signal.

The timing control unit may output the timing control signals to delay the transition timings of the strobe signal in response to even data of output data having substantially the same waveform as an inverted strobe signal.

In accordance with another embodiment of the present invention, an apparatus for generating an output data strobe signal includes: a timing control unit configured to detect a specific data pattern of output data and to generate a plurality of timing control signals corresponding to the detected data pattern in response to a clock signal; and an strobe signal generating unit configured to generate a strobe signal and an inverted strobe signal in response to the clock signal, and to adjust a cross point voltage between the strobe signal and the inverted strobe signal in response to the timing control signals.

The timing control unit may output the timing control signals to advance the transition timing of the strobe signal and to delay the transition timing of the inverted strobe signal in response to even data of the output data having substantially the same waveform as the strobe signal.

The timing control unit may output the timing control signals to delay the transition timing of the strobe signal and to advance the transition timing of the inverted strobe signal in response to even data of the output data having substantially the same waveform as the inverted strobe signal.

DESCRIPTION OF SPECIFIC EMBODIMENTS

Figure 1:
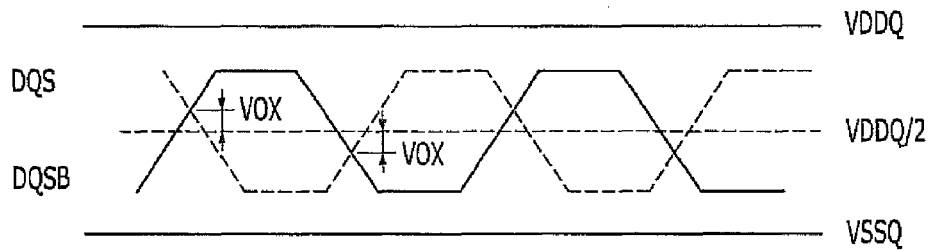
FIG. 1 is a waveform diagram illustrating "Vox" characteristics denoting a voltage difference between an output cross point voltage of a DQS signal and a DQSB signal and a half power supply voltage (VDDQ/2) of an output driver.
Figure 2:
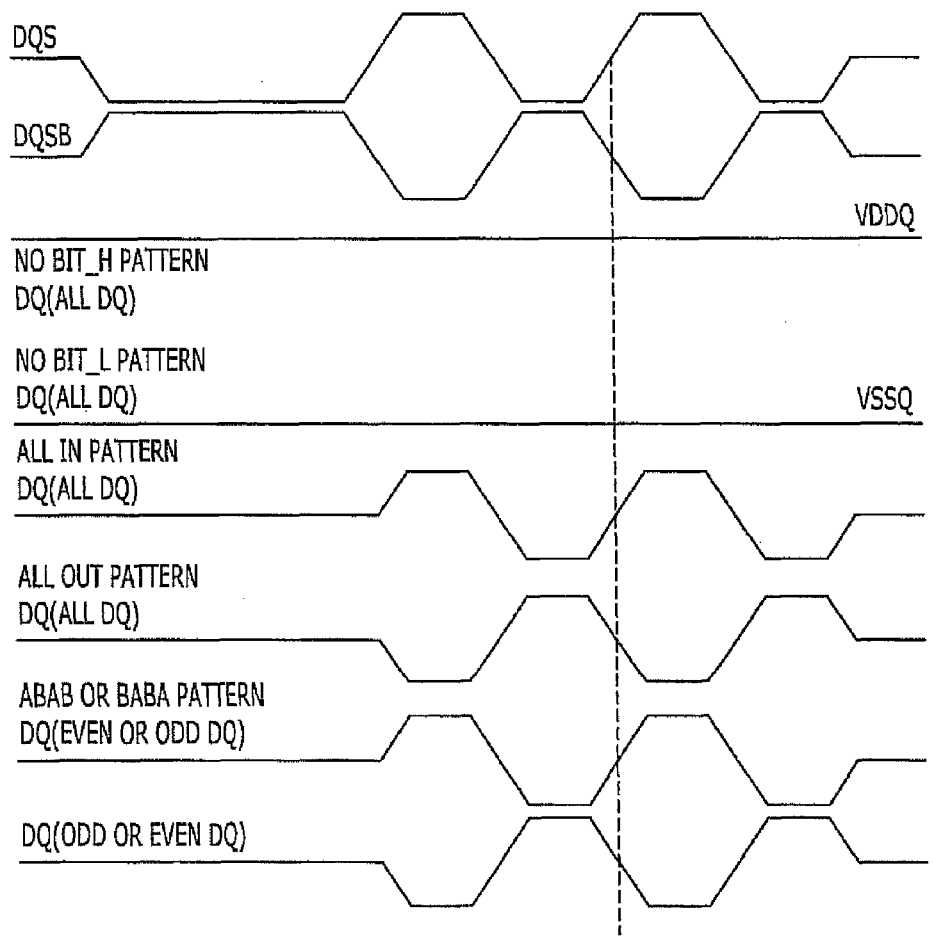
FIG. 2 is a waveform diagram illustrating various data patterns.
Figure 3:
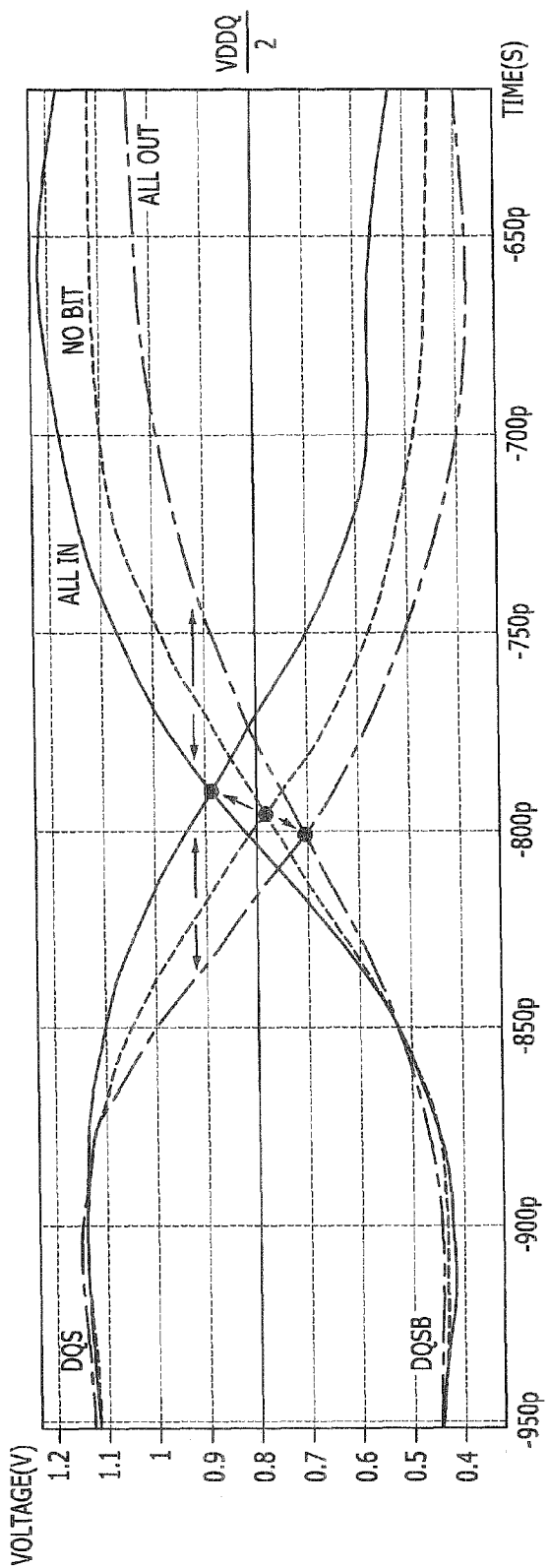
FIG. 3 is a timing diagram illustrating variations of the Vox characteristics with respect to ALL-IN and ALL-OUT data patterns on the basis of a NO-BIT data pattern.
Figure 4:
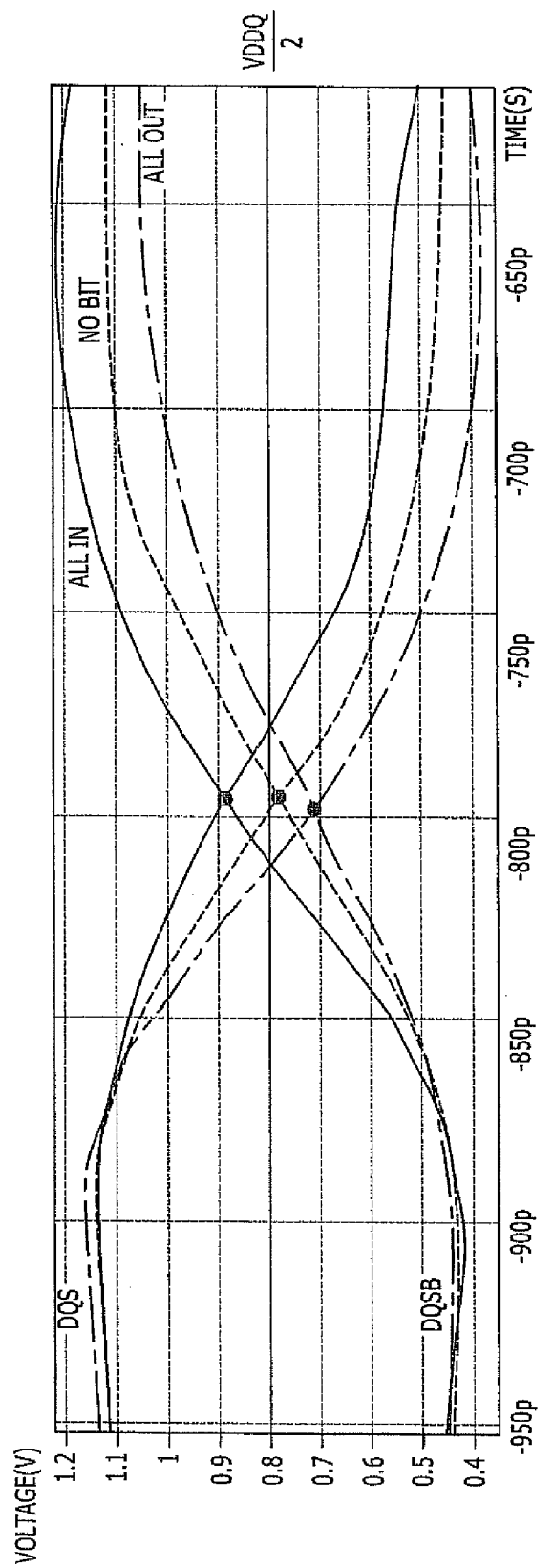
FIG. 4 is a timing diagram illustrating variations of the Vox characteristics with respect to ABAB and BABA data patterns on the basis of the NO-BIT data pattern.

Exemplary embodiments of the present invention are described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various drawing figures and embodiments of the present invention.

Figure 5:
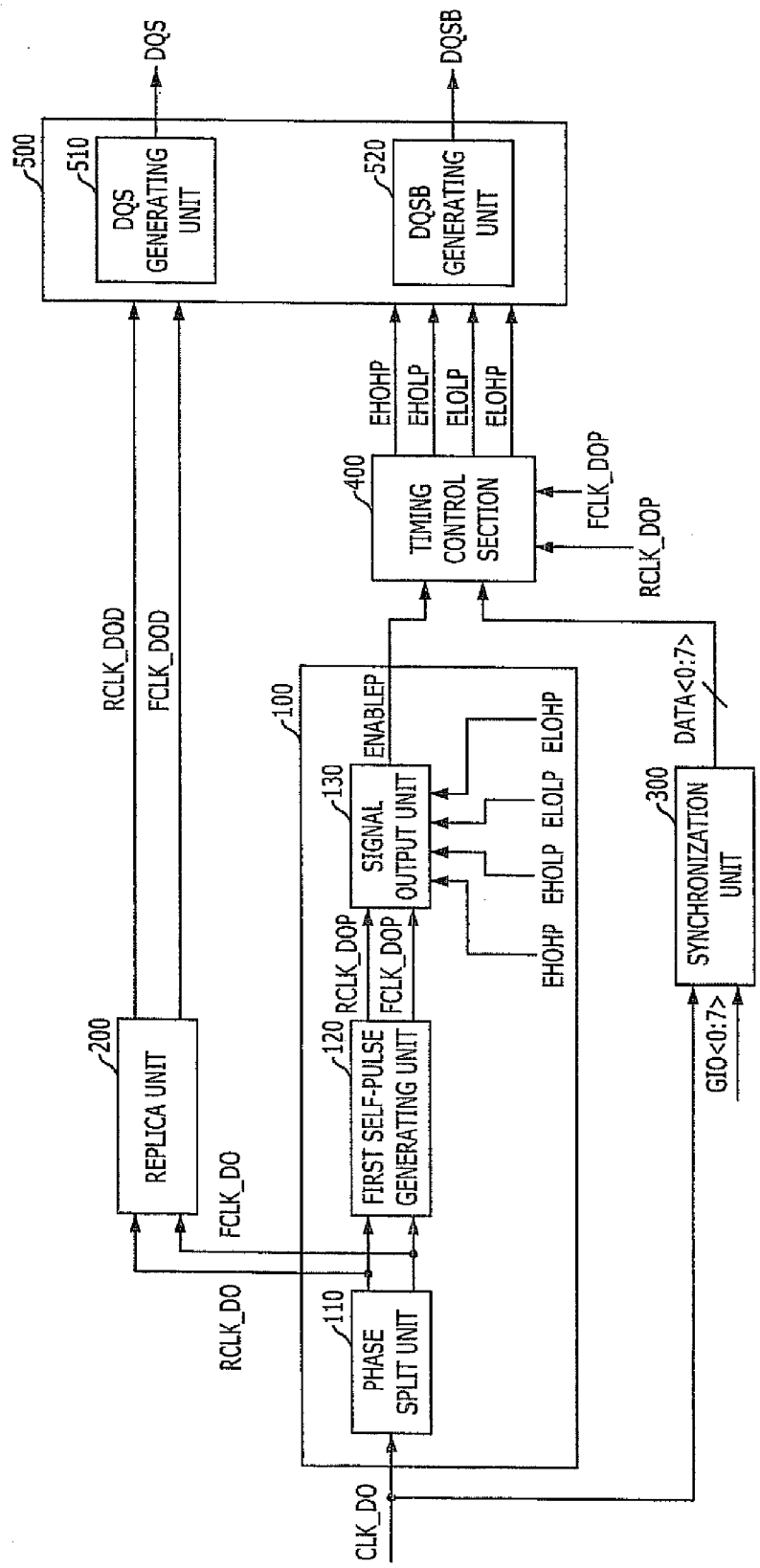
FIG. 5 is a block diagram of an output data strobe signal generating apparatus of a semiconductor memory device in accordance with an embodiment of the present invention.

FIG. 5 is a block diagram of an output data strobe signal generating apparatus of a semiconductor memory device in accordance with an embodiment of the present invention.

Referring to FIG. 5, the output data strobe signal generating apparatus in accordance with this embodiment of the present invention includes an enable signal generating section 100, a timing control section 400, and a strobe signal generating section 500.

The enable signal generating section 100 generates an enable signal ENABLEP which is activated for a preset time period when a clock signal CLK_DO transitions. The timing control section 400 detects a data pattern of output data DATA<0:7>, which affects Vox characteristics, and generates a plurality of output data strobe (DQS) timing control signals EHOHP, EHOLP, ELOLP and ELOHP based on the detected data pattern when the enable signal ENABLEP is activated. The strobe signal generating section 500 outputs a DQS signal and an inverted output data strobe (DQSB) signal in synchronization with the clock signal CLK_DO by adjusting transition timings of the DQS signal and the DQSB signal in response to the DQS timing control signals EHOHP, EHOLP, ELOLP and ELOHP.

The output data strobe signal generating apparatus further includes a synchronization unit 300 configured to receive global data GIO<0:7> and to output the received global data GIO<0:7> in synchronization with the clock signal CLK_DO as the output data DATA<0:7>. Since such a synchronization unit for receiving input data and to output the received data in synchronization with a clock signal is well known to those skilled in the art, a detailed description thereof has been omitted.

The enable signal generating section 100 includes a phase split unit 110, a first self-pulse generating unit 120, and a signal output unit 130.

The phase split unit 110 generates a rising clock RCLK_DO and a falling clock FCLK_DO by splitting phases of the clock signal CLK_DO. The rising clock RCLK_DO has a phase opposite to the falling clock FCLK_DO, and is activated for a high-level duration of the clock signal CLK_DO whereas the falling clock FCLK_DO is activated for a low-level duration of the clock signal CLK_DO. The first self-pulse generating unit 120 generates a rising clock pulse RCLK_DOP activated for a preset time period of an activation section of the rising clock RCLK_DO, and a falling clock pulse FCLK_DOP activated for a preset time period of an activation section of the falling clock FCLK_DO. The signal output unit 130 outputs the enable signal ENABLEP activated whenever the rising clock pulse RCLK_DOP and the falling clock pulse FCLK_DOP are enabled. For reference, in order to adjust the transition timings of the DQS signal and the DQSB signal only when the data pattern affecting the Vox characteristic is detected, the signal output unit 130 receives the DQS timing control signals EHOHP, EHOLP, ELOLP and ELOHP, and activates the enable signal ENABLEP when any of the DQS timing control signals is activated.

The output data strobe signal generating apparatus further includes a replica unit 200 configured to delay the rising clock RCLK_DO and the falling clock FCLK_DO by a preset time period corresponding to a processing time of the first self-pulse generating unit 120, the signal output unit 130 and the timing control section 400 to provide a delayed rising clock RCLK_DOD and a delayed falling clock FCLK_DOD for the strobe signal generating section 500.

The strobe signal generating section 500 includes a DQS generating unit 510 and a DQSB generating unit 520. The DQS generating unit 510 generates the DQS signal in response to the delayed rising clock RCLK_DOD and the delayed falling clock FCLK_DOD output from the replica unit 200 by adjusting the transition timings of the DQS signal and the DQSB signal in response to the DQS timing control signals EHOHP, EHOLP, ELOLP and ELOHP output by the timing control section 400. The DQSB generating unit 520 generates the DQSB signal in response to the delayed rising clock RCLK_DOD and the delayed falling clock FCLK_DOD by adjusting the transition timings of the DQS signal and the DQSB signal in response to the DQS timing control signals EHOHP, EHOLP, ELOLP and ELOHP.

Although the above description has been made of the semiconductor memory device including the output data strobe signal generating apparatus, the present invention is not limited to this structure. For example, the present invention can apply to controlling the timing of a data strobe signal or a control signal relating to data of a data input/output apparatus.

Hereinafter, a detailed structure of the output data strobe signal generating apparatus of the semiconductor memory device according to an embodiment of the present invention is described in detail.

Figure 6:
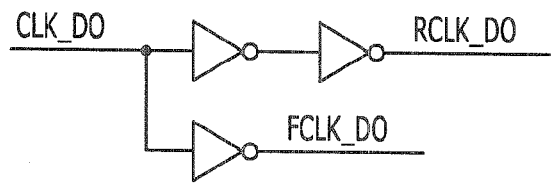
FIG. 6 is a detailed circuit diagram of a phase split unit shown in FIG. 5.

FIG. 6 is a detailed circuit diagram of the phase split unit 110 shown in FIG. 5.

Referring to FIG. 6, the phase split unit 110 includes a plurality of inverters to generate the rising clock RCLK_DO and the falling clock FCLK_DO. The rising clock RCLK_DO has a phase opposite to the falling clock FCLK_DO, and is activated for a high-level duration of the clock signal CLK_DO whereas the falling clock FCLK_DO is activated for a low-level duration of the clock signal CLK_DO.

Figure 7A:
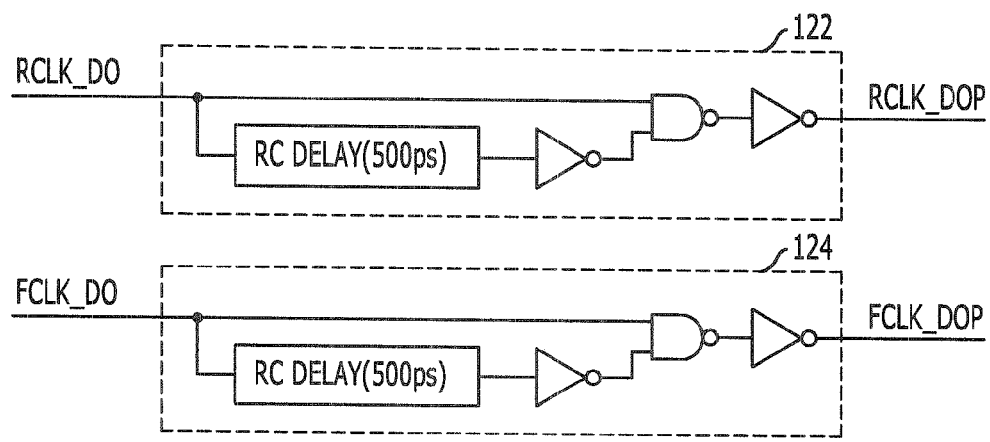
FIGS. 7A and 7B are a detailed circuit diagram and a waveform diagram of a first self-pulse generating unit shown in FIG. 5.
Figure 7B:
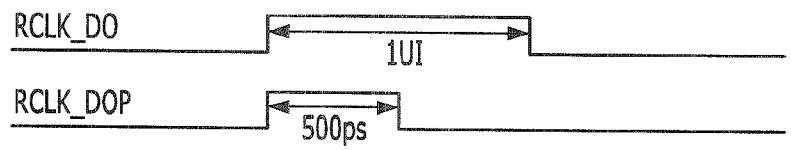

FIGS. 7A and 7B are a detailed circuit diagram and a waveform diagram of the first self-pulse generating unit 120 shown in FIG. 5.

Referring to FIG. 7A, the first self-pulse generating unit 120 includes a rising clock pulse generator 122 and a falling clock pulse generator 124. The rising clock pulse generator 122 generates the rising clock pulse RCLK_DOP activated only for a preset time period of an activation section of the rising clock RCLK_DO having a pulse width corresponding to a one-bit effective window (1 UI). The falling clock pulse generator 124 generates the falling clock pulse FCLK_DOP activated only for a preset time period of an activation section of the falling clock FCLK_DO having a pulse width corresponding to a one-bit effective window (1 UI).

Referring to FIG. 7B, the rising clock pulse generator 122 activates the rising clock pulse RCLK_DOP when the rising clock RCLK_DO of the one-bit effective window (1 UI) transitions from a logic low level to a logic high level, and maintains the rising clock pulse RCLK_DOP of the logic high level to have a self-pulse width of approximately 500 ps. The self-pulse of the rising clock pulse RCLK_DOP may differ according to a delay circuit provided in the rising clock pulse generator 122. Since an operation of the falling clock pulse generator 124 is substantially the same as that of the rising clock pulse generator 122, a detailed description thereof has been omitted.

Figure 8A:
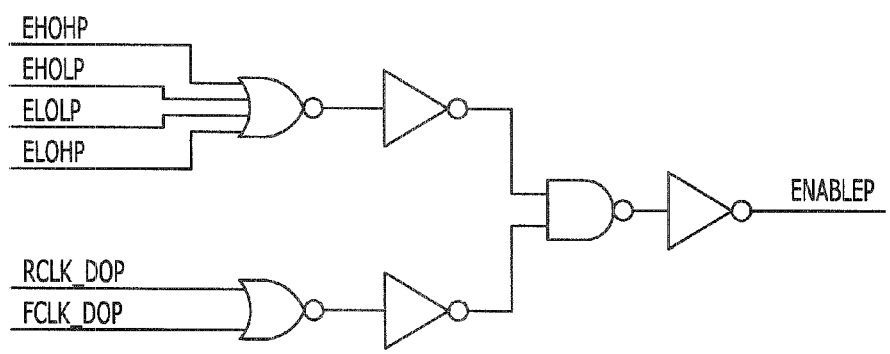
FIGS. 8A and 8B are a detailed circuit diagram and a waveform diagram of a signal output unit shown in FIG. 5.
Figure 8B:
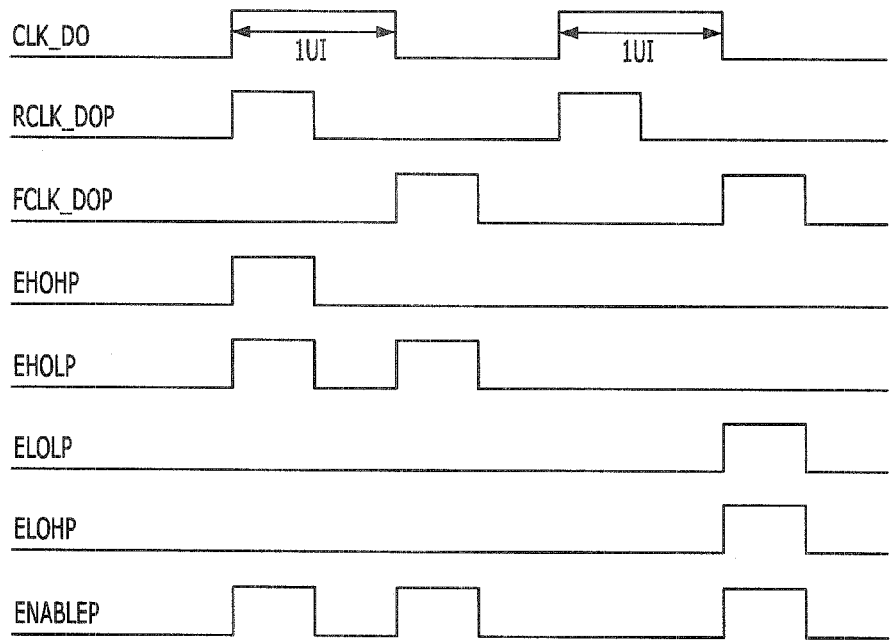

FIGS. 8A and 8B are a detailed circuit diagram and a waveform diagram of the signal output unit 130 shown in FIG. 5.

Referring to FIG. 8A, the signal output unit 130 receives the DQS timing control signals EHOHP, EHOLP, ELOLP and ELOHP fed back from the timing control section 400 to generate the enable signal ENABLEP when the rising clock pulse RCLK_DOP and the falling clock pulse FCLK_DOP are enabled based on the DQS timing control signals EHOHP, EHOLP, ELOLP and ELOHP.

In detail, referring to FIG. 8B, the signal output unit 130 performs an OR operation and an AND operation to activate the enable signal ENABLEP when any of the DQS timing control signals EHOHP, EHOLP, ELOLP and ELOHP is activated, and either of the rising clock pulse RCLK_DOP and the falling clock pulse FCLK_DOP is activated.

Figure 9:
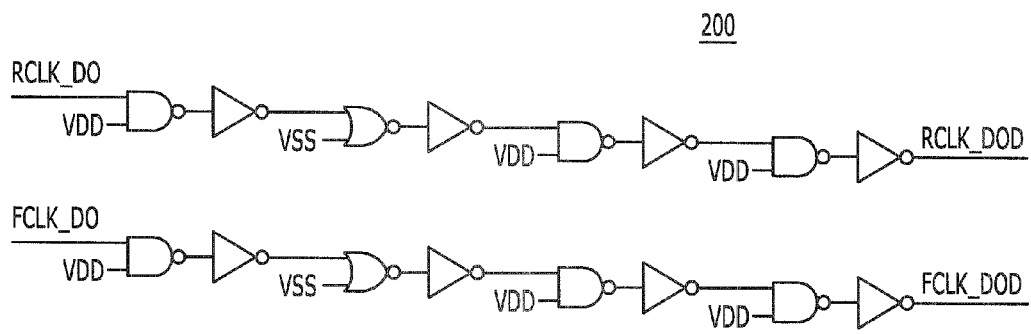
FIG. 9 is a detailed circuit diagram of a replica unit shown in FIG. 5.

FIG. 9 is a detailed circuit diagram of the replica unit 200 shown in FIG. 5.

Referring to FIG. 9, the replica unit 200 includes a plurality of logic gates corresponding to internal circuits of the first self-pulse generating unit 120, the signal output unit 130 and the timing control section 400 to delay the rising clock RCLK_DO and the falling clock FCLK_DO by a processing time thereof. Accordingly, the replica unit 200 provides the delayed rising clock RCLK_DOD and delayed falling clock FCLK_DOD for the strobe signal generating section 500. The number of logic gates provided in the replica unit 200 may differ according to the internal circuits of the first self-pulse generating unit 120, the signal output unit 130 and the timing control section 400.

Figure 10:
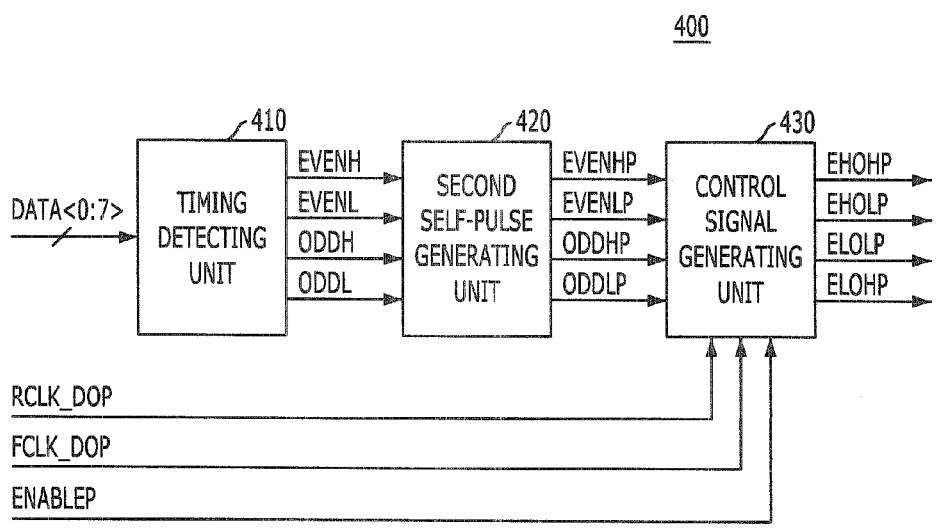
FIG. 10 is a detailed block diagram of a timing control section shown in FIG. 5.

FIG. 10 is a detailed block diagram of the timing control section 400 shown in FIG. 5.

Referring to FIG. 10, the timing control section 400 includes a data pattern detecting unit 410, a second self-pulse generating unit 420 and a control signal generating unit 430.

The data pattern detecting unit 410 generates first to fourth data pattern signals EVENH, EVENL, ODDH, and ODDL by detecting the data pattern of the output data DATA<0:7>, which affects the Vox characteristics. The second self-pulse generating unit 420 generates first to fourth data pattern pulse signals EVENHP, EVENLP, ODDHP and ODDLP, each of which is activated for a preset time period during an activation section of a corresponding one of the first to fourth data pattern signals EVENH, EVENL, ODDH and ODDL. The control signal generating unit 430 generates first to fourth DQS timing control signals EHOHP, EHOLP, ELOLP and ELOHP corresponding to the first to fourth data pattern pulse signals EVENHP, EVENLP, ODDHP and ODDLP in response to the rising clock pulse RCLK_DOP and the falling clock pulse FCLK_DOP when the enable signal ENABLEP is activated.

Hereinafter, referring to FIGS. 11 to 13, the detailed structure of the timing control section 400 according to the embodiment will be described in detail.

Figure 11:
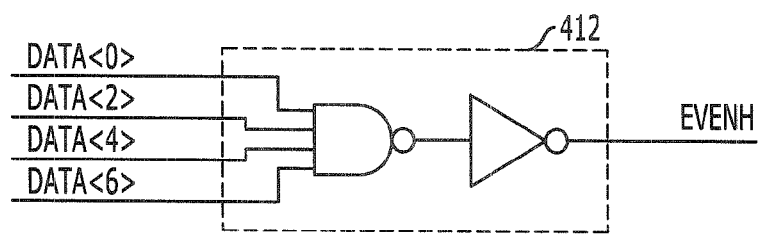
FIG. 11 is a detailed circuit diagram of a data pattern detecting unit shown in FIG. 10.
Figure 11:
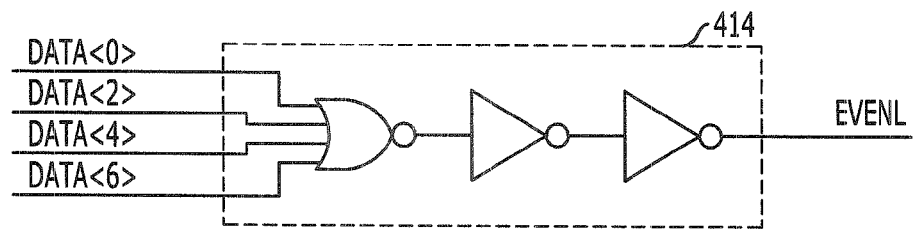
Figure 11:
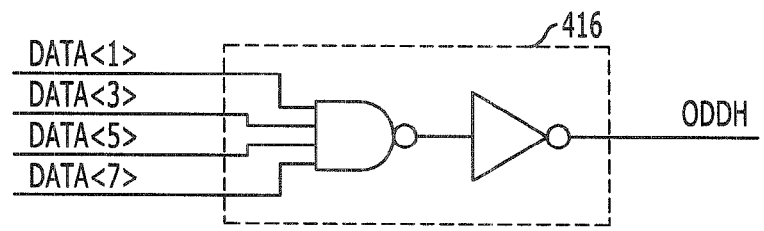
Figure 11:
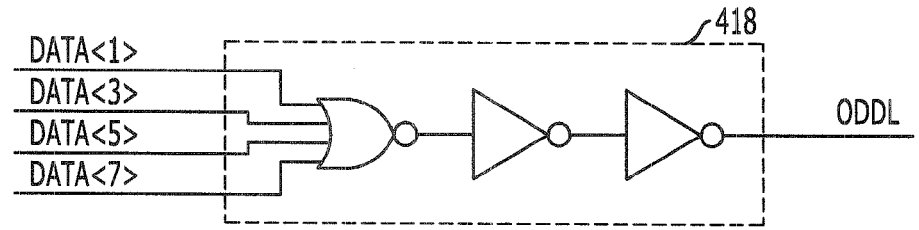

FIG. 11 is a detailed circuit diagram of the data pattern detecting unit 410 shown in FIG. 10.

Referring to FIG. 11, the data pattern detecting unit 410 detects the data pattern of the output data DATA_0:7> to activate corresponding ones of the first to fourth data pattern signals EVENH, EVENL, ODDH, and ODDL based on the detected data pattern.

In detail, the data pattern detecting unit 410 includes first to fourth data pattern signal generators 412, 414, 416 and 418. The first data pattern signal generator 412 performs an AND operation to raise the first data pattern signal EVENH to a logic high level when all of the even output data, such as DQ<0>, DQ<2>, DQ<4> and DQ<6>, are at a logic high level. The second data pattern signal generator 414 performs a NOR operation to raise the second data pattern signal EVENL to a logic high level when all of the even output data, such as DQ<0>, DQ<2>, DQ<4> and DQ<6>, are at a logic low level. The third data pattern signal generator 416 performs an AND operation to raise the third data pattern signal ODDH to a logic high level when all of the odd output data, such as DQ<1>, DQ<3>, DQ<5> and DQ<7>, are at a logic high level. The fourth data pattern signal generator 418 performs a NOR operation to raise the fourth data pattern signal ODDL to a logic high level when all of the odd output data, such as DQ<1>, DQ<3>, DQ<5> and DQ<7>, are at a logic low level.

The timing control section 400 includes the second self-pulse generating unit 420 configured to generate the data pattern pulse signals which are at a logic high level for a preset time period during an activation section of the data pattern signals so as not to generate the data pattern signals when the data pattern does not change on the basis of a one-bit effective window (1 UI).

Figure 12A:
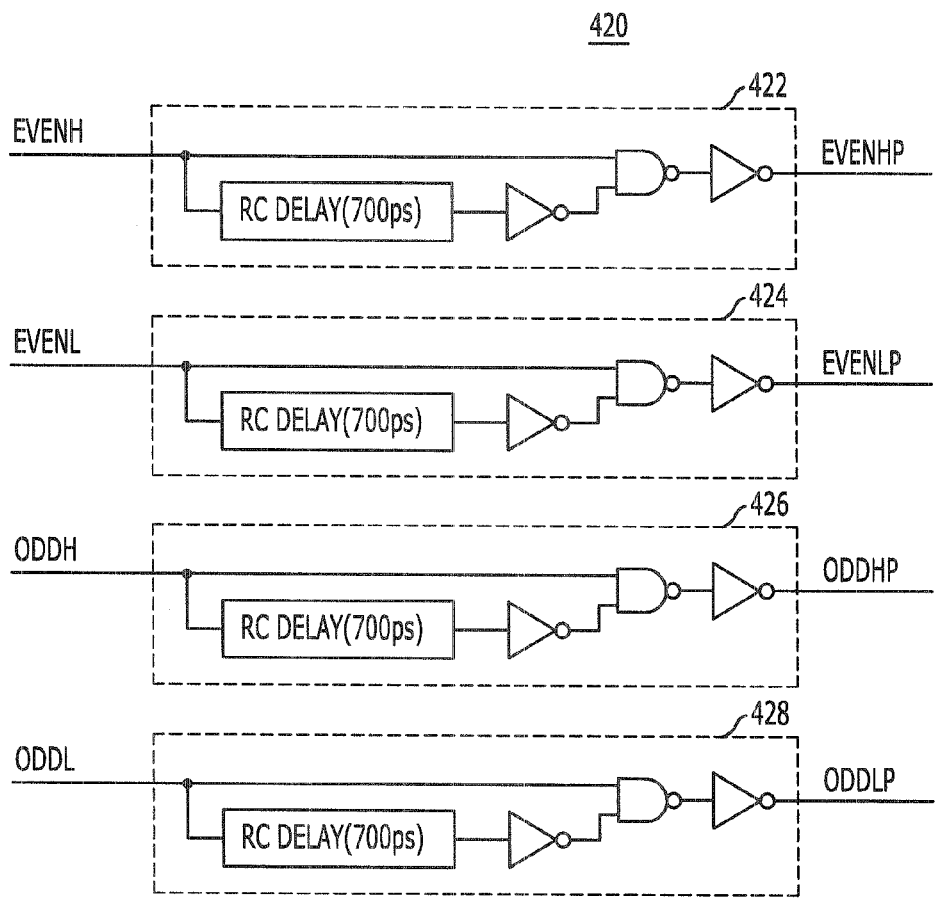
FIGS. 12A and 12B are a detailed circuit diagram and a waveform diagram of a second self-pulse generating unit shown in FIG. 10.
Figure 12B:
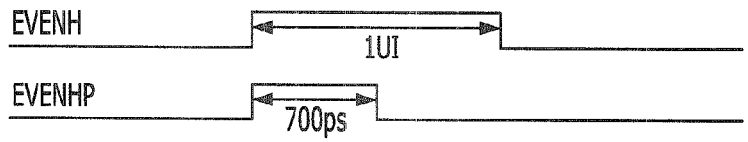

FIGS. 12A and 12B are a detailed circuit diagram and a waveform diagram of the second self-pulse generating unit 420 shown in FIG. 10.

Referring to FIG. 12A, the second self-pulse generating unit 420 includes first to fourth pulse generators 422, 424, 426 and 428 to generate the first to fourth data pattern pulse signals EVENHP, EVENLP, ODDHP and ODDLP having a self-pulse width when each of the first to fourth data pattern signals EVENH, EVENL, ODDH and ODDL has a pulse width of a one-bit effective window (1 UI). Herein, the self-pulse of the first to fourth data pattern pulse signals EVENHP, EVENLP, ODDHP and ODDLP corresponding to each data pattern signal is approximately 700 ps, which is greater than that of the enable signal ENABLEP of approximately 500 ps.

Referring to FIG. 12B, it is assumed that the first data pattern signal EVENH has a pulse width of a one-bit effective window (1 UI). The first pulse generator 422 activates the first data pattern pulse signal EVENHP when the first data pattern signal EVENH transitions from a logic low level to a logic high level, and maintains the first data pattern pulse signal EVENHP of the logic high level to have a self-pulse width of approximately 700 ps. The self-pulse of the first data pattern pulse signal EVENHP may differ according to a delay circuit provided in the first pulse generator 422. Since operations of the second to fourth pulse generators 424 to 428 are substantially the same as that of the first pulse generator 422, a detailed description thereof has been omitted.

Figure 13:
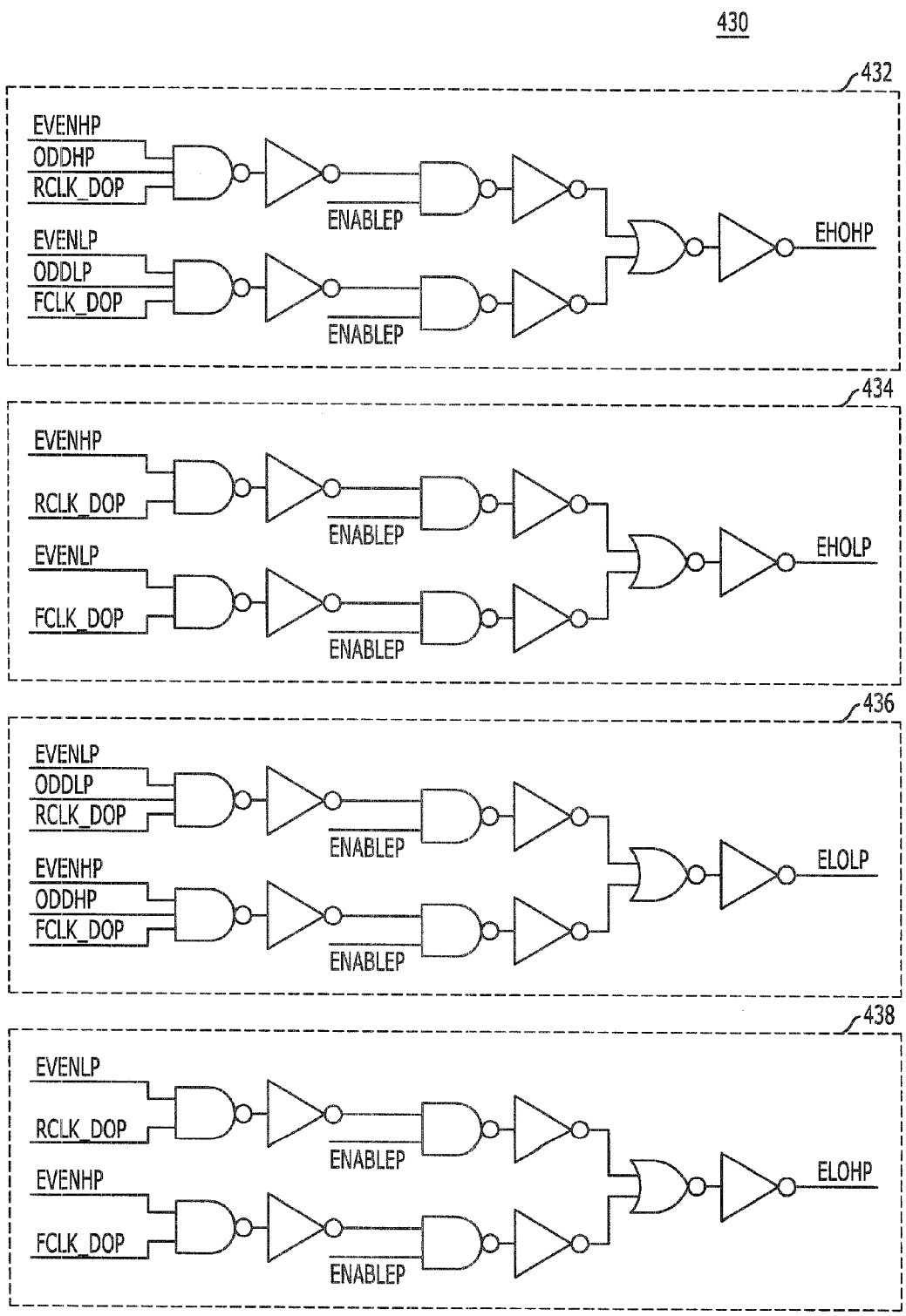
FIG. 13 is a detailed circuit diagram of a control signal generating unit shown in FIG. 10.

FIG. 13 is a detailed circuit diagram of the control signal generating unit 430 shown in FIG. 10.

Referring to FIG. 13, the control signal generating unit 430 includes first to fourth timing control signal generators 432, 434, 436 and 438 configured to generate the first to fourth DQS timing control signals EHOHP, EHOLP, ELOLP and ELOHP when the enable signal ENABLEP is activated.

If the enable signal ENABLEP is activated, the first timing control signal generator 432 generates the first DQS timing control signal EHOHP when the rising clock pulse RCLK_DOP is activated and both of the first and third data pattern pulse signals EVENHP and ODDHP are activated, or when the falling clock pulse FCLK_DOP is activated and both of the second and fourth data pattern pulse signals EVENLP and ODDLP are activated.

If the enable signal ENABLEP is activated, the second timing control signal generator 434 generates the second DQS timing control signal EHOLP when the rising clock pulse RCLK_DOP is activated and the first data pattern pulse signal EVENHP is activated, or when the falling clock pulse FCLK_DOP is activated and the second data pattern pulse signal EVENLP is activated.

If the enable signal ENABLEP is activated, the third timing control signal generator 436 generates the third DQS timing control signal ELOLP when the rising clock pulse RCLK_DOP is activated and both of the second and fourth data pattern pulse signals EVENLP and ODDLP are activated, or when the falling clock pulse FCLK_DOP is activated and both of the first and third data pattern pulse signals EVENHP and ODDHP are activated.

If the enable signal ENABLEP is activated, the fourth timing control signal generator 438 generates the fourth DQS timing control signal ELOHP when the rising clock pulse RCLK_DOP is activated and the second data pattern pulse signal EVENLP is activated, or when the falling clock pulse FCLK_DOP is activated and the first data pattern pulse signal EVENHP is activated.

Figure 14A:
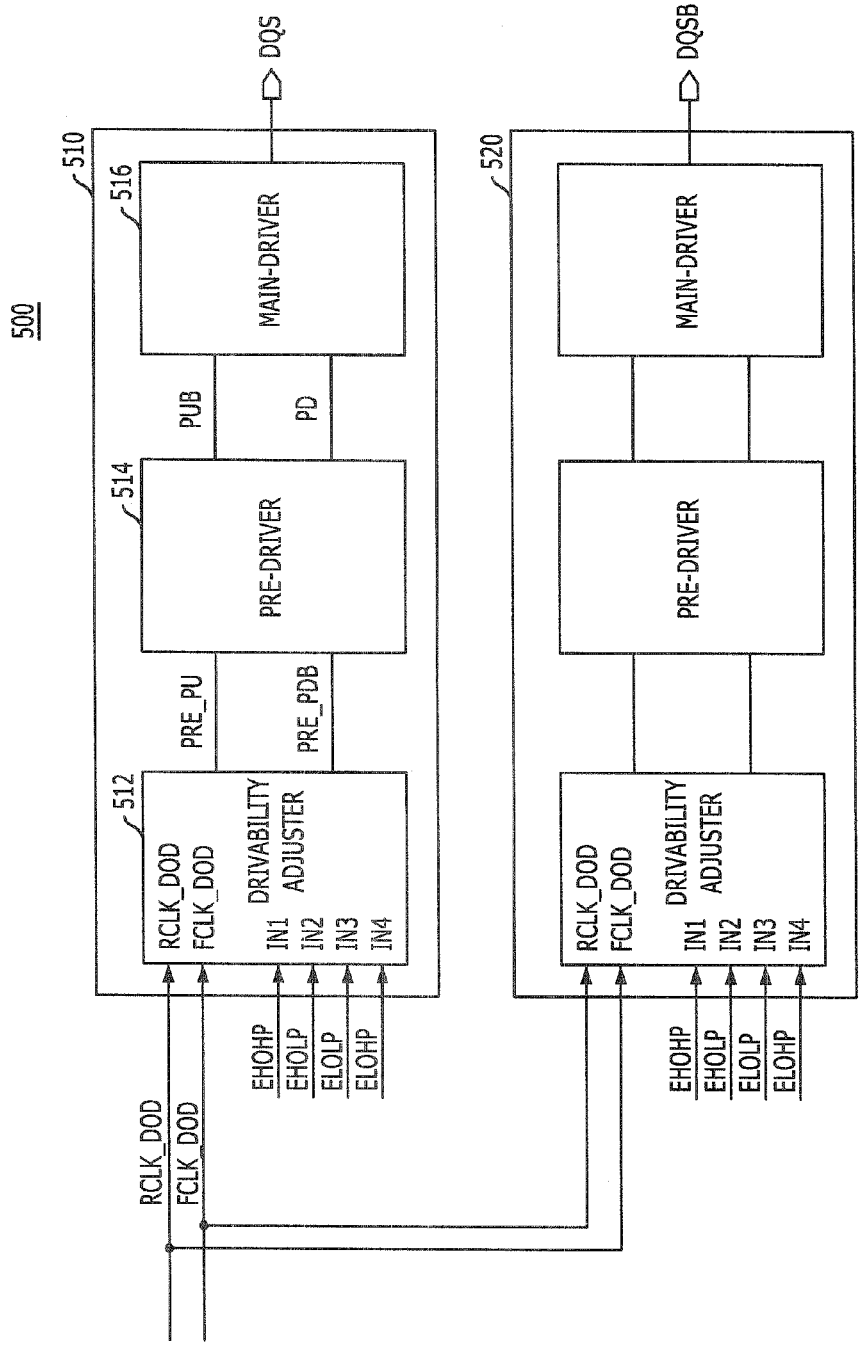
FIGS. 14A and 14B are a block diagram and a detailed circuit diagram of a strobe signal generating section shown in FIG. 5.
Figure 14B:
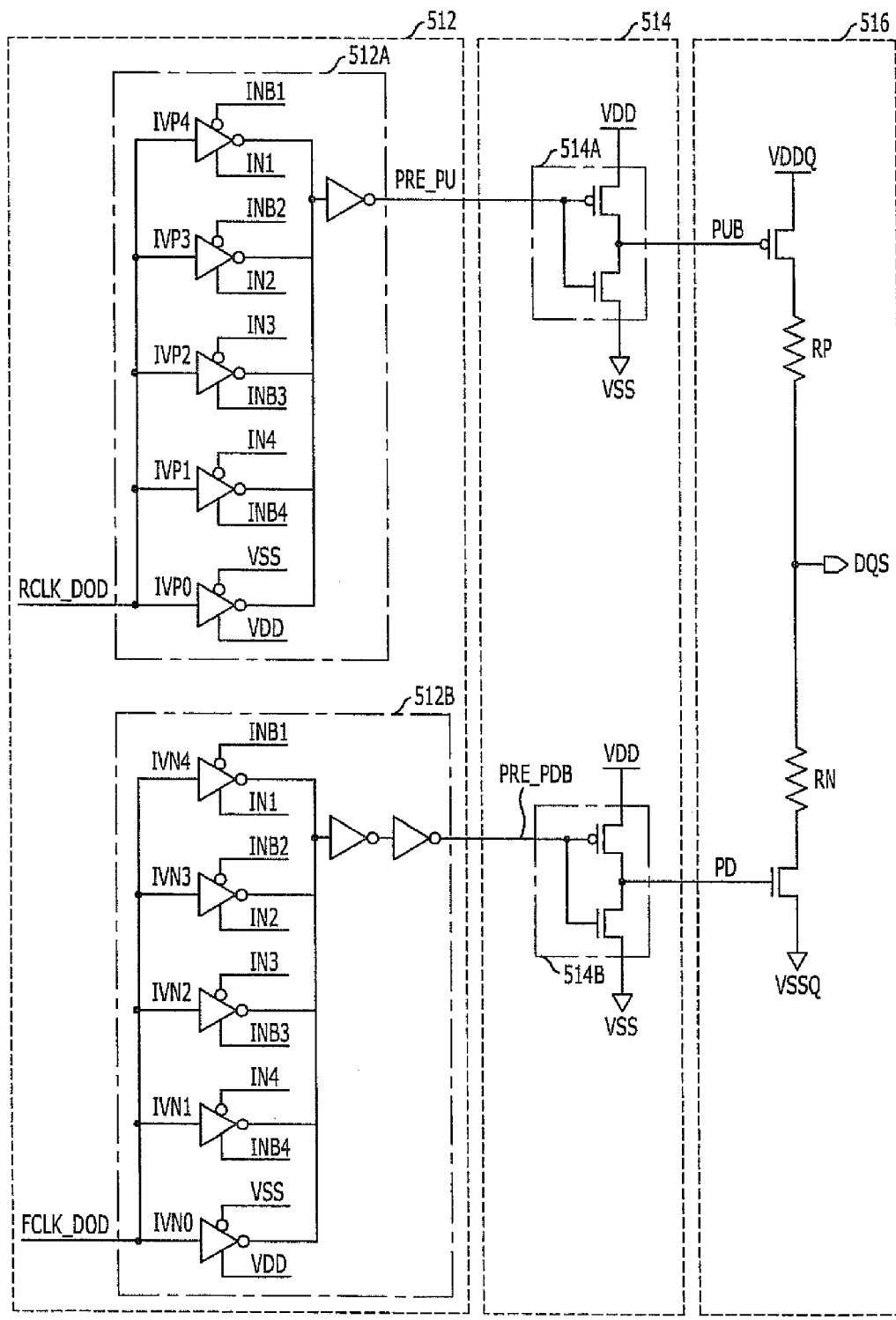

FIGS. 14A and 14B are a block diagram and a detailed circuit diagram of the strobe signal generating section 500 shown in FIG. 5. Since the DQSB generating unit 520 has substantially the same structure as that of the DQS generating unit 510 except that rising and falling clock signals are input in reverse, a detailed description thereof has been omitted.

Referring to FIG. 14A, the DQS generating unit 510 includes a drivability adjuster 512, a pre-driver 514, and a main-driver 516. The drivability adjuster 512 adjusts drivability of the delayed rising clock RCLK_DOD and the delayed falling clock FCLK_DOD in response to the first to fourth DQS timing control signals EHOHP, EHOLP, ELOLP and ELOHP, thereby outputting a pre-pull up driving signal PRE_PU and a pre-pull down driving signal PRE_PDB whose drivability is adjusted. The pre-driver 514 drives the DQS signal to be pre-pulled up or down in response to the pre-pull up driving signal PRE_PU and the pre-pull down driving signal PRE_PDB, thereby outputting a pull-up driving signal PUB and a pull-down driving signal PD. The main-driver 516 drives the DQS signal to be pulled up or down in response to the pull-up driving signal PUB and the pull-down driving signal PD.

In detail, referring to FIG. 14B, the drivability adjuster 512 includes a pull-up drivability adjuster 512A and a pull-down drivability adjuster 512B.

The pull-up drivability adjuster 512A includes a plurality of three-phase pull-up inverters IVP0, IVP1, IVP2, IVP3 and IVP4 receiving the delayed rising clock RCLK_DOD and turned on in response to the first to fourth DQS timing control signals EHOHP, EHOLP, ELOLP and ELOHP. The pull-up drivability adjuster 512A adjusts the drivability of the delayed rising clock RCLK_DOD by controlling the number of turned-on inverters among the plural three-phase pull-up inverters IVP0 to IVP4, thereby outputting the adjusted signal as the pre-pull up driving signal PRE_PU. For reference, the first pull-up inverter IVP0 is always turned on so as to transfer the delayed rising clock RCLK_DOD to the pre-driver 514 even if the other pull-up inverters IVP1 to IVP4 are turned off.

The pull-down drivability adjuster 512B includes a plurality of three-phase pull-down inverters IVN0, IVN1, IVN2, IVN3 and IVN4 receiving the delayed falling clock FCLK- _DOD and turned on in response to the first to fourth DQS timing control signals EHOHP, EHOLP, ELOLP and ELOHP. The pull-down drivability adjuster 512B adjusts the drivability of the delayed falling clock FCLK_DOD by controlling the number of turned-on inverters among the plural three-phase pull-down inverters IVN0 to IVN4, and inverts the adjusted signal, thereby outputting the inverted signal as the pre-pull down driving signal PRE_PDB. For reference, the first pull-down inverter IVN0 is always turned on so as to transfer the delayed falling clock FCLK_DOD to the pre-driver 514 even if the other pull-down inverters IVN1 to IVN4 are turned off.

The pre-driver 514 includes first and second pre-drivers 514A and 514B. The first pre-driver 514A includes a PMOS transistor and an NMOS transistor coupled in series between a first power supply voltage VDD and a first ground voltage VSS, thereby pulling up or down the pull-up driving signal PUB in response to the pre-pull up driving signal PRE_PU. The second pre-driver 514B includes a PMOS transistor and an NMOS transistor coupled in series between the first power supply voltage VDD and the first ground voltage VSS, thereby pulling up or down the pull-down driving signal PD in response to the pre-pull down driving signal PRE_PDB.

The main-driver 516 includes a PMOS transistor and an NMOS transistor coupled in series between a second power supply voltage VDDQ and a second ground voltage VSSQ, thereby pulling up or down the DQS signal in response to the pull-up driving signal PUB and the pull-down driving signal PD.

Hereinafter, a method for generating an output data strobe signal according to an embodiment of the present invention is described in detail with reference to FIGS. 5 to 14B.

First, Table 1 shows logic states of the first to fourth data pattern signals EVENH, EVENL, ODDH and ODDL, and the first to fourth DQS timing control signals EHOHP, EHOLP, ELOLP and ELOHP, and an operation of the drivability adjuster 512 for adjusting a rising timing of the DQS signal.

Next, in the case of the ABAB data pattern where all of the even output data have substantially the same waveform as the DQS signal while all of the odd output data have substantially the same waveform as the DQSB signal, when the delayed rising clock RCLK_DOD is activated, all of the even output data become a logic high level according to the DQS signal while all of the odd output data become a logic low level according to the DQSB signal, and thus the first and fourth data pattern signals EVENH and ODDL are activated.

Accordingly, the second DQS timing control signals EHOLP is activated, and thus, the first to fourth pull-up inverters IVP0 to IVP3 except for the fifth pull-up inverter IVP4 are turned on. As a result, the delayed rising clock RCLK_DOD is transferred to the pre-driver 514 with the second greatest drivability in a short time. That is, the rising timing of the DQS signal in the ABAB data pattern is advanced so as to be faster than in the NO-BIT data pattern and slower than in ALL-IN data pattern.

In the case of the ALL-OUT data pattern where all of the output data have substantially the same waveform as the DQSB signal, when the delayed rising clock RCLK_DOD is activated, all of the even and odd output data become a logic low level according to the DQSB signal, and thus, the second and fourth data pattern signals EVENL and ODDL are activated. Accordingly, the third and fourth DQS timing control signals ELOLP and ELOHP are activated, and thus, all of the pull-up inverters IVP1 to IVP4 except for the first pull-up inverter IVP0 are turned off. As a result, the delayed rising clock RCLK_DOD is transferred to the pre-driver 514 with the smallest drivability in a short time. That is, the rising timing of the DQS signal in the ALL-OUT data pattern is delayed so as to be slower than in the NO-BIT data pattern.

In the case of the BABA data pattern where all of the odd output data have substantially the same waveform as the DQS signal while all of the even output data have substantially the same waveform as the DQSB signal, when the delayed rising clock RCLK_DOD is activated, all of the odd output data become a logic high level according to the DQS signal while

TABLE 1

| Data pattern | data pattern signals | | | | DQS timing control signals | | | | drivability adjuster | | | |
|---|---|---|---|---|---|---|---|---|---|---|---|---|
| | EVENH | EVENL | ODDH | ODDL | EHOHP | EHOLP | ELOLP | ELOHP | IVP4 (IN1) | IVP3 (IN2) | IVP2 (IN3) | IVP1 (IN4) |
| ALL-IN | H | L | H | L | H | H | L | L | ON | ON | ON | ON |
| ABAB | H | L | L | H | L | H | L | L | OFF | ON | ON | ON |
| ALL-OUT | L | H | L | H | L | L | H | H | OFF | OFF | OFF | OFF |
| BABA | L | H | H | L | L | L | L | H | OFF | OFF | ON | OFF |

Referring to Table 1, in the case of the ALL-IN data pattern where all of the output data have substantially the same waveform as the DQS signal, when the delayed rising clock RCLK_DOD, indicating the rising timing of the DQS signal, is activated, all of the even and odd output data become a logic high level according to the DQS signal and thus the first and third data pattern signals EVENH and ODDH are activated. Accordingly, the first and second DQS timing control signals EHOHP and EHOLP are activated, and thus, all of the pull-up inverters IVP0 to IVP4 of the pull-up drivability adjuster 512A in the drivability adjuster 512 are turned on. As a result, the delayed rising clock RCLK_DOD is transferred to the pre-driver 514 with the greatest drivability in a short time. That is, the rising timing of the DQS signal in the ALL-IN data pattern is advanced so as to be faster than in the NO-BIT data pattern.

all of the even output data become a logic low level according to the DQSB signal, and thus the second and third data pattern signals EVENL and ODDH are activated. Accordingly, the fourth DQS timing control signal ELOHP is activated, and thus, only the first and third pull-up inverters IVP0 and IVP2 are turned on. As a result, the delayed rising clock RCLK_DOD is transferred to the pre-driver 514 with the second smallest drivability. That is, the rising timing of the DQS signal in the BABA data pattern is delayed so as to be slower than in the NO-BIT data pattern and faster than in ALL-OUT data pattern.

Table 2 shows logic states of the first to fourth data pattern signals EVENH, EVENL, ODDH, and ODDL, and the first to fourth DQS timing control signals EHOHP, EHOLP, ELOLP and ELOHP, and an operation of the drivability adjuster 512 for adjusting a falling timing of the DQS signal.

TABLE 2

| Data pattern | data pattern signals | | | | DQS timing control signals | | | | drivability adjuster | | | |
|---|---|---|---|---|---|---|---|---|---|---|---|---|
| | EVENH | EVENL | ODDH | ODDL | EHOHP | EHOLP | ELOLP | ELOHP | IVN4 (IN1) | IVN3 (IN2) | IVN2 (IN3) | IVN1 (IN4) |
| ALL-IN | L | H | L | H | H | H | L | L | ON | ON | ON | ON |
| ABAB | L | H | H | L | L | H | L | L | OFF | ON | ON | ON |
| ALL-OUT | H | L | H | L | L | L | H | H | OFF | OFF | OFF | OFF |
| BABA | H | L | L | H | L | L | L | H | OFF | OFF | ON | OFF |

Referring to Table 2, in the case of the ALL-IN data pattern, when the delayed falling clock FCLK_DOD, indicating the falling timing of the DQS signal, is activated, all of the even and odd output data become a logic low level according to the DQS signal and thus the second and fourth data pattern signals EVENL and ODDL are activated. Accordingly, the first and second DQS timing control signals EHOHP and EHOLP are activated, and thus, all of the pull-down inverters IVN0 to IVN4 of the pull-down drivability adjuster 512B in the drivability adjuster 512 are turned on. As a result, the delayed falling clock FCLK_DOD is transferred to the pre-driver 514 with the greatest drivability in a short time. That is, the falling timing of the DQS signal in the ALL-IN data pattern is advanced so as to be faster than in the NO-BIT data pattern.

Next, in the case of the ABAB data pattern, when the delayed falling clock FCLK_DOD is activated, all of the even output data become a logic low level according to the DQS signal while all of the odd output data become a logic high level according to the DQSB signal, and thus the second and third data pattern signals EVENL and ODDH are activated. Accordingly, the second DQS timing control signal EHOLP is activated, and thus, the first to fourth pull-down inverters IVN0 to IVN3 except for the fifth pull-down inverter IVN4 are turned on. As a result, the delayed falling clock FCLK_DOD is transferred to the pre-driver 514 with the second greatest drivability in a short time. That is, the falling timing of the DQS signal in the ABAB data pattern is advanced so as to be faster than in the NO-BIT data pattern and slower than in the ALL-IN data pattern.

In the case of the ALL-OUT data pattern, when the delayed falling clock FCLK_DOD is activated, all of the even and odd output data become a logic high level according to the DQSB signal, and thus, the first and third data pattern signals EVENH and ODDH are activated. Accordingly, the third and fourth DQS timing control signals ELOLP and ELOHP are activated, and thus, all of the pull-down inverters IVN1 to IVN4 except for the first pull-down inverter IVN0 are turned off. As a result, the delayed falling clock FCLK_DOD is transferred to the pre-driver 514 with the smallest drivability in a short time. That is, the falling timing of the DQS signal in the ALL-OUT data pattern is delayed so as to be slower than in the NO-BIT data pattern.

In the case of the BABA data pattern, when the delayed falling clock FCLK_DOD is activated, all of the odd output data become a logic low level according to the DQS signal while all of the even output data become a logic high level according to the DQSB signal, and thus the first and fourth data pattern signals EVENH and ODDL are activated. Accordingly, the fourth DQS timing control signal ELOHP is activated, and thus, only the first and third pull-down inverters IVN0 and IVN2 are turned on. As a result, the delayed falling clock FCLK_DOD is transferred to the pre-driver 514 with the second smallest drivability. That is, the falling timing of the DQS signal in the BABA data pattern is delayed so as to be slower than in the NO-BIT data pattern and faster than in ALL-OUT data pattern.

Table 3 shows logic states and an operation for adjusting a rising timing of the DQSB signal, and Table 4 shows logic states and an operation for adjusting a falling timing of the DQSB signal.

Since a method for adjusting the rising and falling timing of the DQSB signal is substantially the same as that of the DQS signal except for swapping the delayed rising clock RCLK_DOD for the delayed falling clock FCLK_DOD, a detailed description thereof has been omitted.

TABLE 3

| Data pattern | data pattern signals | | | | DQS timing control signals | | | | drivability adjuster | | | |
|---|---|---|---|---|---|---|---|---|---|---|---|---|
| | EVENH | EVENL | ODDH | ODDL | EHOHP | EHOLP | ELOLP | ELOHP | IVN4 (IN1) | IVN3 (IN2) | IVN2 (IN3) | IVN1 (IN4) |
| ALL-IN | L | H | L | H | L | L | H | H | OFF | OFF | OFF | OFF |
| ABAB | L | H | H | L | L | L | L | H | OFF | OFF | ON | OFF |
| ALL-OUT | H | L | H | L | H | H | | LL | ON | ON | ON | ON |
| BABA | H | L | L | H | L | H | L | L | OFF | ON | ON | ON |

TABLE 4

| Data pattern | data pattern signals | | | | DQS timing control signals | | | | drivability adjuster | | | |
|---|---|---|---|---|---|---|---|---|---|---|---|---|
| | EVENH | EVENL | ODDH | ODDL | EHOHP | EHOLP | ELOLP | ELOHP | IVP4 (IN1) | IVP3 (IN2) | IVP2 (IN3) | IVP1 (IN4) |
| ALL-IN | H | L | H | L | L | L | H | H | OFF | OFF | OFF | OFF |
| ABAB | H | L | L | H | L | L | L | H | OFF | OFF | ON | OFF |

TABLE 4-continued

| Data pattern | data pattern signals | | | | DQS timing control signals | | | | drivability adjuster | | | |
|---|---|---|---|---|---|---|---|---|---|---|---|---|
| | EVENH | EVENL | ODDH | ODDL | EHOHP | EHOLP | ELOLP | ELOHP | IVP4 (IN1) | IVP3 (IN2) | IVP2 (IN3) | IVP1 (IN4) |
| ALL-OUT | L | H | L | H | H | H | L | L | ON | ON | ON | ON |
| BABA | L | H | H | L | L | H | L | L | OFF | ON | ON | ON |

For reference, in accordance with the embodiment of the present invention, the "Vox" characteristics are more affected by the data patterns of the even output data than the odd output data. Thus, in the case of the ALL-IN and ABAB data patterns whose even output data have substantially the same waveform as the DQS signal, the rising and falling timings of the DQS signal are advanced while the rising and falling timings of the DQSB signal are delayed. On the contrary, in the case of the ALL-OUT and BABA data patterns whose even output data have substantially the same waveform as the DQSB signal, the rising and falling timings of the DQS signal are delayed while the rising and falling timings of the DQSB signal are advanced.

Figure 15:
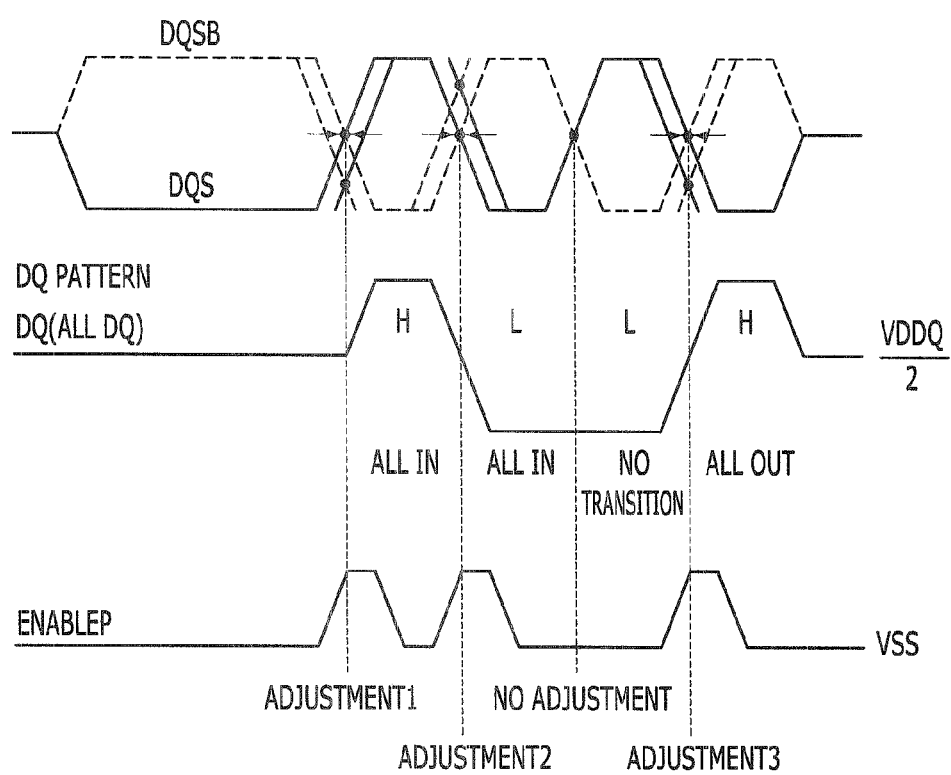
FIG. 15 is a timing diagram illustrating an adjustment to the Vox characteristics of a semiconductor memory device in accordance with an embodiment of the present invention.

FIG. 15 is a timing diagram illustrating an adjustment to transition timings of the DQS signal and the DQSB signal of a semiconductor memory device in accordance with an embodiment of the present invention.

Referring to FIG. 15, in the case of a first adjustment, since all of the output data have substantially the same waveform as the DQS signal in the ALL-IN data pattern, a rising timing of the DQS signal is delayed ((+) delay amount) while a falling time of the DQSB signal is advanced ((−) delay amount) as compared with the NO_BIT data pattern.

In this case, referring to Table 1, the semiconductor memory device in accordance with the embodiment of the present invention turns on all of the pull-up inverters IVP0 to IVP4 of the pull-up drivability adjuster 512A in the DQS generating unit 510. Accordingly, the rising timing of the DQS signal is advanced ((−) delay amount).

Further, referring to Table 4, the semiconductor memory device turns off all of the pull-up inverters IVP1 to IVP4 except for the first pull-up inverter IVP0 of the pull-up drivability adjuster in the DQSB generating unit 520. Accordingly, the falling timing of the DQSB signal is delayed ((+) delay amount). As a result, in the case of the first adjustment, the output cross point voltage of the DQS signal and the DQSB signal is adjusted to be positioned near a voltage level of a half power supply voltage (VDDQ/2) from below the voltage level of the VDDQ/2, i.e., a (−) position. Accordingly, the Vox characteristics are improved.

Next, in the case of a second adjustment, since all of the output data have substantially the same waveform as the DQS signal in the ALL-IN data pattern, a falling timing of the DQS signal is delayed ((+) delay amount) while a rising time of the DQSB signal is advanced ((−) delay amount) as compared with the NO_BIT data pattern.

In this case, referring to Table 2, the semiconductor memory device in accordance with the embodiment of the present invention turns on all of the pull-down inverters IVN0 to IVN4 of the pull-down drivability adjuster 512B in the DQS generating unit 510. Accordingly, the falling timing of the DQS signal is advanced ((−) delay amount). Further, referring to Table 3, the semiconductor memory device turns off all of the pull-down inverters IVN1 to IVN4 except for the first pull-down inverter IVN0 of the pull-down drivability adjuster in the DQSB generating unit 520. Accordingly, the rising timing of the DQSB signal is delayed ((+) delay amount). As a result, in the case of the second adjustment, the output cross point voltage of the DQS signal and the DQSB signal is adjusted to be positioned near the voltage level of the VDDQ/2 from above the voltage level of the VDDQ/2, i.e., a (+) position. Accordingly, the Vox characteristics are improved.

Subsequently, in the case of no adjustment where the output data maintain a previous state, i.e., there are no transitions, such as the NO-BIT data pattern, the output cross point voltage of the DQS signal and the DQSB signal is not adjusted since the enable signal ENABLEP is not activated.

Finally, in the case of a third adjustment, since all of the output data have substantially the same waveform as the DQSB signal in the ALL-OUT data pattern, a falling timing of the DQS signal is advanced ((−) delay amount) while a rising time of the DQSB signal is delayed ((+) delay amount) as compared with the NO_BIT data pattern.

In this case, referring to Table 2, the semiconductor memory device in accordance with the embodiment of the present invention turns off all of the pull-down inverters IVN1 to IVN4 except for the first pull-down inverter IVN0 of the pull-down drivability adjuster 512B in the DQS generating unit 510. Accordingly, the falling timing of the DQS signal is delayed ((+) delay amount). Further, referring to Table 3, the semiconductor memory device turns on all of the pull-down inverters IVN0 to IVN4 of the pull-down drivability adjuster in the DQSB generating unit 520. Accordingly, the rising timing of the DQSB signal is advanced ((−) delay amount). As a result, in the case of the third adjustment, the output cross point voltage of the DQS signal and the DQSB signal is adjusted to be positioned near the voltage level of the VDDQ/2 from below the voltage level of the VDDQ/2, i.e., a (−) position. Accordingly, the Vox characteristics are improved.

Although the above description refers to a semiconductor memory device including four data patterns, the present invention is not limited to the specific data pattern. For example, the present invention can apply to a semiconductor memory device including various data patterns by controlling the number of turned-on inverters. Further, although the above description refers to the semiconductor memory device as an example, it is well known to those skilled in the art that the present invention can apply to controlling timing of a data strobe signal or controlling a control signal relating to data of a data input/output apparatus.

As described above, in accordance with the embodiments of the present invention, when a data strobe signal, such as a DQS signal and a DQSB signal is output, the semiconductor memory device adjusts rising and falling timings of the data strobe signal in response to DQS timing control signals generated by detecting data patterns of output data, which affects the Vox characteristics denoting a voltage difference between an output cross point voltage of the DQS signal and the DQSB signal and a half power supply voltage (VDDQ/2) of an output driver (TX). Accordingly, the embodiments of the present invention can minimize variations of the "Vox" characteristics according to the data pattern to thereby satisfy a desired specification.

Furthermore, the embodiments of the present invention can recognize the data patterns in advance before data are output from the semiconductor memory device, and minimize variations of the "Vox" characteristics according to the data pattern. Accordingly, it is possible to accurately perform a data transmission of the semiconductor memory device.

While the present invention has been described with respect to the specific embodiments, it will be apparent to those skilled in the art that various changes and modifications may be made without departing from the spirit and scope of the present invention as defined by the following claims.

Furthermore, in the above embodiments, the illustrated logic gates and transistors may be implemented to have different locations and types according to polarities of signals inputted thereto.

What is claimed is:

1. An apparatus comprising:
   a timing control unit configured to detect a specific data pattern and to generate a plurality of timing control signals corresponding to the detected data pattern in response to a clock signal; and
   a strobe signal generating unit configured to generate at least one strobe signal in response to the clock signal, and to adjust transition timings of the at least one strobe signal in response to the plurality of timing control signals.

2. The apparatus of claim 1, wherein the timing control unit outputs the timing control signals to advance the transition timings of the strobe signal in response to even data of output data having substantially the same waveform as the strobe signal.

3. The apparatus of claim 1, wherein the timing control unit outputs the timing control signals to delay the transition timings of the strobe signal in response to even data of output data having substantially the same waveform as an inverted strobe signal.

4. The apparatus of claim 1, further comprising:
   an enable signal generating unit configured to generate an enable signal activated for a preset time period in response to the clock signal transitioning to enable the generation of the timing control signals of the timing control unit.

5. The apparatus of claim 4, wherein the timing control unit comprises:
   a data pattern detecting unit configured to generate a plurality of data pattern signals by detecting the data pattern; and
   a control signal generating unit configured to generate the timing control signals based on the data pattern signals in response to transitions of the clock signal and the enable signal being activated.

6. The apparatus of claim 4, wherein the strobe signal generating unit comprises:
   a drivability adjusting unit configured to adjust drivability of the clock signal in response to the timing control signals; and
   a driving unit configured to drive the strobe signal to be pulled either up or down in response to the adjusted clock signal.

7. The apparatus of claim 6, wherein the drivability adjusting unit comprises a plurality of three-phase inverters receiving the clock signal and turned on in response to the timing control signals.

8. An apparatus for generating an output data strobe signal, the apparatus comprising:
   a timing control unit configured to detect a specific data pattern of output data and to generate a plurality of timing control signals corresponding to the detected data pattern in response to a clock signal; and
   an strobe signal generating unit configured to generate a strobe signal and an inverted strobe signal in response to the clock signal, and to adjust a cross point voltage between the strobe signal and the inverted strobe signal in response to the timing control signals.

9. The apparatus of claim 8, wherein the timing control unit outputs the timing control signals to advance a transition timing of the strobe signal and to delay a transition timing of the inverted strobe signal in response to even data of the output data having substantially the same waveform as the strobe signal.

10. The apparatus of claim 8, wherein the timing control unit outputs the timing control signals to delay a transition timing of the strobe signal and to advance a transition timing of the inverted strobe signal in response to even data of the output data having substantially the same waveform as the inverted strobe signal.

11. The apparatus of claim 8, further comprising:
    an enable signal generating unit configured to generate an enable signal activated for a preset time period in response to the clock signal transitioning to enable the generation of the timing control signals of the timing control unit.

12. The apparatus of claim 11, wherein the enable signal generating unit comprises:
    a phase split unit configured to generate a rising clock and a falling clock by splitting phases of the clock signal;
    a first self-pulse generating unit configured to generate a rising clock pulse activated for a preset time period of an activation section of the rising clock, and a falling clock pulse activated for a preset time period of an activation section of the falling clock; and
    a signal output unit configured to output the enable signal activated in response to any of the timing control signals being activated, and the rising clock pulse and the falling clock pulse being activated.

13. The apparatus of claim 12, wherein the timing control unit comprises:
    a data pattern detecting unit configured to generate a plurality of data pattern signals by detecting the data pattern;
    a second self-pulse generating unit configured to generate a plurality of data pattern pulse signals, each of which is activated for a preset time period during an activation section of a corresponding one of the data pattern signals; and
    a control signal generating unit configured to generate the timing control signals based on the data pattern pulse signals in response to the rising clock pulse and the falling clock pulse and the enable signal being activated.

14. The apparatus of claim 13, wherein the data pattern detecting unit comprises:
    a first data pattern signal generator configured to activate a first data pattern signal in response to all of even data of the output data becoming a logic high level;
    a second data pattern signal generator configured to activate a second data pattern signal in response to all of the even data of the output data becoming a logic low level;
    a third data pattern signal generator configured to activate a third data pattern signal in response to all of odd data of the output data becoming a logic high level; and a fourth data pattern signal generator configured to activate a fourth data pattern signal in response to all of the odd data of the output data becoming a logic low level.

15. The apparatus of claim 14, wherein the control signal generating unit comprises:
   a first timing control signal generator configured to generate a first timing control signal in response to either the rising clock pulse being activated and both the first and third data pattern pulse signals being activated, or in response to the falling clock pulse being activated and both the second and fourth data pattern pulse signals being activated, and the enable signal being activated;
   a second timing control signal generator configured to generate a second timing control signal in response to either the rising clock pulse being activated and the first data pattern pulse signal being activated, or in response to the falling clock pulse being activated and the second data pattern pulse signal being activated, and the enable signal being activated;
   a third timing control signal generator configured to generate a third timing control signal in response to either the rising clock pulse being activated and both of the second and fourth data pattern pulse signals being activated, or in response to the falling clock pulse being activated and both of the first and third data pattern pulse signals being activated, and the enable signal being activated; and
   a fourth timing control signal generator configured to generate a fourth timing control signal in response to either the rising clock pulse being activated and the second data pattern pulse signal being activated, or in response to the falling clock pulse being activated and the first data pattern pulse signal being activated, and the enable signal being activated.

16. The apparatus of claim 15, wherein the timing control unit activates the first and second timing control signals to advance a transition timing of the strobe signal by a first amount, and to delay a transition timing of the inverted strobe signal by a second amount, in response to all of the output data having substantially the same waveform as the strobe signal.

17. The apparatus of claim 16, wherein the timing control unit activates the second timing control signals to advance the transition timing of the strobe signal by a third amount smaller than the first amount, and to delay the transition timing of the inverted strobe signal by a fourth amount smaller than the second amount, in response to all of the even data of the output data having substantially the same waveform as the strobe signal and all of the odd data of the output data having substantially the same waveform as the inverted strobe signal.

18. The apparatus of claim 15, wherein the timing control unit activates the third and fourth timing control signals to delay a transition timing of the strobe signal by a first amount, and to advance a transition timing of the inverted strobe signal by a second amount, in response to all of the output data having substantially the same waveform as the inverted strobe signal.

19. The apparatus of claim 16, wherein the timing control unit activates the fourth timing control signals to delay the transition timing of the strobe signal by a third amount smaller than the first amount, and to advance the transition timing of the inverted strobe signal by a fourth amount smaller than the second amount, in response to all of the odd data of the output data have substantially the same waveform as the strobe signal and all of the even data of the output data having substantially the same waveform as the inverted strobe signal.

20. The apparatus of claim 12, further comprising:
   a synchronization unit configured to receive global data to output the received global data as the output data in synchronization with the clock signal; and
   a replica unit configured to delay the rising clock and the falling clock by a preset time period corresponding to a processing time of the first self-pulse generating unit, the signal output unit and the timing control unit to provide a delayed rising clock and a delayed falling clock for the strobe signal generating unit.

21. The apparatus of claim 20, wherein the strobe signal generating unit comprises:
   a drivability adjusting unit configured to adjust drivability of the delayed rising clock and the delayed falling clock in response to the timing control signals; and
   a driving unit configured to drive the strobe signal and the inverted strobe signal to be pulled up or down in response to the adjusted rising and falling clocks.

22. The apparatus of claim 21, the drivability adjusting unit comprises:
   a pull-up drivability adjuster configured to include a plurality of three-phase pull-up inverters receiving the delayed rising clock and turned on in response to the timing control signals, wherein the pull-up drivability adjuster adjusts the drivability of the delayed rising clock by controlling a number of turned-on inverters; and
   a pull-down drivability adjuster configured to include a plurality of three-phase pull-down inverters receiving the delayed falling clock and turned on in response to the timing control signals, wherein the pull-down drivability adjuster adjusts the drivability of the delayed falling clock by controlling the number of turned-on inverters.

* * * * *